(12) United States Patent
Plaut et al.

(10) Patent No.: US 8,008,783 B2
(45) Date of Patent: Aug. 30, 2011

(54) DICING TAPE AND DIE ATTACH ADHESIVE WITH PATTERNED BACKING

(75) Inventors: David J. Plaut, Minneapolis, MN (US); Eric G. Larson, Lake Elmo, MN (US); Joel A. Getschel, Osceola, WI (US); Olester Benson, Jr., Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/946,185

(22) Filed: Nov. 15, 2010

(65) Prior Publication Data

US 2011/0064948 A1    Mar. 17, 2011

Related U.S. Application Data

(62) Division of application No. 12/399,054, filed on Mar. 6, 2009, now Pat. No. 7,858,499.

(60) Provisional application No. 61/034,791, filed on Mar. 7, 2008.

(51) Int. Cl.
    *H01L 23/48* (2006.01)
(52) U.S. Cl. ......... 257/783; 257/E21.214; 257/E21.599; 257/E21.505; 438/464; 438/459; 156/60
(58) Field of Classification Search .......... 438/464, 438/459; 257/E21.214, 783, E21.599; 156/60
See application file for complete search history.

(56) References Cited

U.S. PATENT DOCUMENTS

| | | | |
|---|---|---|---|
| 4,308,331 A | 12/1981 | Narita et al. | |
| 4,879,430 A | 11/1989 | Hoffman | |
| 5,049,085 A * | 9/1991 | Reylek et al. | 439/91 |
| 5,110,388 A | 5/1992 | Komiyama et al. | |
| 5,118,567 A | 6/1992 | Komiyama et al. | |
| 5,139,804 A | 8/1992 | Hoffman | |
| 5,356,949 A | 10/1994 | Komiyama et al. | |
| 5,525,422 A | 6/1996 | Spies et al. | |
| 5,705,016 A | 1/1998 | Senoo et al. | |
| 5,888,606 A | 3/1999 | Senoo et al. | |
| 7,129,150 B2 | 10/2006 | Kawai | |
| 7,534,498 B2 * | 5/2009 | Noda et al. | 428/446 |
| 2002/0050061 A1 | 5/2002 | Komyoji et al. | |
| 2002/0076848 A1 | 6/2002 | Spooner et al. | |
| 2005/0031795 A1 | 2/2005 | Chaudhury et al. | |
| 2006/0211220 A1 * | 9/2006 | Sakaya et al. | 438/464 |

(Continued)

FOREIGN PATENT DOCUMENTS

JP    08-053655    2/1996

(Continued)

OTHER PUBLICATIONS

International Search Report for PCT/US2009/035948, pp. 3.

*Primary Examiner* — Matthew Smith
*Assistant Examiner* — Wilner Jean Baptiste
(74) *Attorney, Agent, or Firm* — Stephen F. Wolf

(57) ABSTRACT

Provided are a tape, apparatus, and method that relate generally to a single layer adhesive which functions as a dicing tape and also as a die attach adhesive for dicing thinned wafers and subsequent die attach operations of the diced chips in semiconductor device fabrication. The tape, apparatus, and method include a backing with a surface modification that includes a pattern.

12 Claims, 2 Drawing Sheets

| U.S. PATENT DOCUMENTS | | | FOREIGN PATENT DOCUMENTS | | |
|---|---|---|---|---|---|
| 2007/0190318 A1 | 8/2007 | Asai et al. | JP | 2004-349441 | 12/2004 |
| 2008/0011415 A1 | 1/2008 | Kiuchi et al. | JP | 2006-104246 | 4/2006 |
| 2010/0035273 A1* | 2/2010 | Axen et al. ............ 435/7.1 | WO | WO 02/06413 A1 | 1/2002 |
| 2010/0056725 A1 | 3/2010 | Larson et al. | | | |

* cited by examiner

US 8,008,783 B2

DICING TAPE AND DIE ATTACH ADHESIVE WITH PATTERNED BACKING

RELATED APPLICATIONS

This application is a divisional of U.S. patent application Ser. No. 12/399,054, filed Mar. 6, 2009, now U.S. Pat. No. 7,858,499, which claims priority to U.S. Provisional Patent Application, 61/034,791, filed Mar. 7, 2008, the disclosures of which are incorporated by reference in their entirety herein.

FIELD

The provided tape, apparatus, and method relate generally to a single layer adhesive which functions as a dicing tape and also as a die attach adhesive for dicing thinned wafers and subsequent die attach operations of the diced chips in semiconductor device fabrication.

BACKGROUND

Wafers of semiconductor material such as silicon and gallium-arsenide with integrated circuits formed thereon have a relatively large diameter. In the production of integrated circuits (IC), such a wafer is adhered to a pressure sensitive adhesive tape, sometimes called a dicing tape, and diced into IC chips. The IC chips are then removed from the dicing tape, an adhesive is applied to the chip or to a substrate, the chip is placed on the substrate and the adhesive is cured to firmly attach the die to the substrate.

Dicing tapes can provide strong adhesion to a semiconductor wafer during the step of dicing the wafer into individual chips. However, the dicing tape also can subsequently provide a sufficiently low adhesion to the die to allow the individual chips to be removed from the tape quickly, cleanly, and easily. That is, it is useful for the dicing tape to have a reduced adhesion when the chip is removed, and there should be very little or no residue from the dicing tape on the chip. Therefore, dicing tapes have been prepared that have a balance of adhesion to the wafer to adhere strongly during the dicing step, but also to release from the individual chips without leaving a residue on the chip when the chip is removed from the tape. Some dicing tapes have been prepared which can be detackified upon exposure to ultraviolet light to improve the clean removal of individual chips. Without a balance of adhesion, it is difficult to carry out the steps of dicing the wafer, picking, and placing the individual chips. If the adhesion of the dicing tape is not balanced and some adhesive remains on the individual chip when it is removed from the dicing tape, additional steps are required to remove the adhesive residue from the chip. These additional steps often include organic solvents. Additionally, if the adhesion of the dicing tape is not balanced, some adhesive can remain on the dicing frame which is used to hold down the wafer, adhesive, and backing during dicing.

After the dicing operation and chip singulation is complete, a second adhesive subsequently must be placed between the chip and the substrate to hold the chip securely in place on a substrate. The second adhesive, often referred to as a die attach adhesive, can be applied to the surface of a chip that is opposite the circuits or it may be applied directly to the substrate to which the chip will be bonded. Using a separate die attach adhesive requires additional steps and equipment to place the adhesive either on the chip or the substrate.

SUMMARY

In view of the foregoing, it is recognized that there is a need for a single layer adhesive film that provides the appropriate balance of adhesion and clean release as required for the wafer dicing function, enables transfer of the adhesive from a film backing after dicing, and also provides the necessary bond required in a subsequent die attach step.

In one aspect, an adhesive transfer dicing tape suitable for consecutive use as a dicing tape and a die attach adhesive is provided that includes an adhesive composition and a backing in contact with the adhesive, wherein the backing comprises a surface modification that includes a pattern, and wherein the adhesive is in contact with at least a portion of the pattern.

In another aspect, an article is provided that includes a backing having a surface modification that includes a pattern, an adhesive in contact with the pattern, a semiconductor wafer in contact with the adhesive, and a dicing frame in contact with the adhesive, wherein the dicing frame surrounds the wafer and at least a part of the adhesive directly under the dicing frame is in contact with at least a portion of the pattern.

In yet another aspect, a method of dicing semiconductor wafers is provided that includes providing an adhesive in contact with a backing that has a surface modification that includes a pattern, attaching a semiconductor wafer to the adhesive, attaching a dicing frame to the adhesive so that the dicing frame is in contact with the adhesive and surrounds the wafer, wherein at least part of the adhesive under the dicing frame is in contact with at least part of the pattern, and dicing the wafer to form chips.

The use of the provided adhesive transfer dicing tape can provide strong adhesion to a semiconductor wafer during the step of dicing the wafer into individual chips and can subsequently provide a sufficiently low adhesion to the die to allow the individual chips to be removed from the tape quickly, cleanly, and easily. At the same time the surface modification that includes a pattern of the backing can provide increased adhesion of the adhesive to the backing so that when the dicing frame is removed, the adhesive under the dicing frame and in contact with the surface modification that includes a pattern of the backing preferentially adheres to the backing, allowing clean removal of the frame.

All scientific and technical terms used herein have meanings commonly used in the art unless otherwise specified. The definitions provided herein are to facilitate understanding of certain terms used frequently herein and are not meant to limit the scope of the present disclosure.

As used herein:

the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

"chip" or "chips" refers to pieces of semiconductor wafers and is used interchangeably with "die" or "dice";

"detackify", "detackification", and "detackifies" refers to a decrease in the amount of tackiness of the adhesive;

"die or dice" refers to pieces of semiconductor wafers after they have been cut or diced; and "ionizing radiation" refers to energetic particles or waves that have the potential to form energetic ions or free radicals in molecules such as gases, and includes, for example, flame treatment, corona treatment, plasma treatment, ion beam treatment, or electron beam treatment.

The above summary is not intended to describe each disclosed embodiment of every implementation of the present invention. The brief description of the drawings and the detailed description which follows more particularly exemplify illustrative embodiments.

BRIEF DESCRIPTION OF THE DRAWINGS

FIG. 4 is a perspective view of the embodiment shown in FIG. 3a.

DETAILED DESCRIPTION

Figure 1:
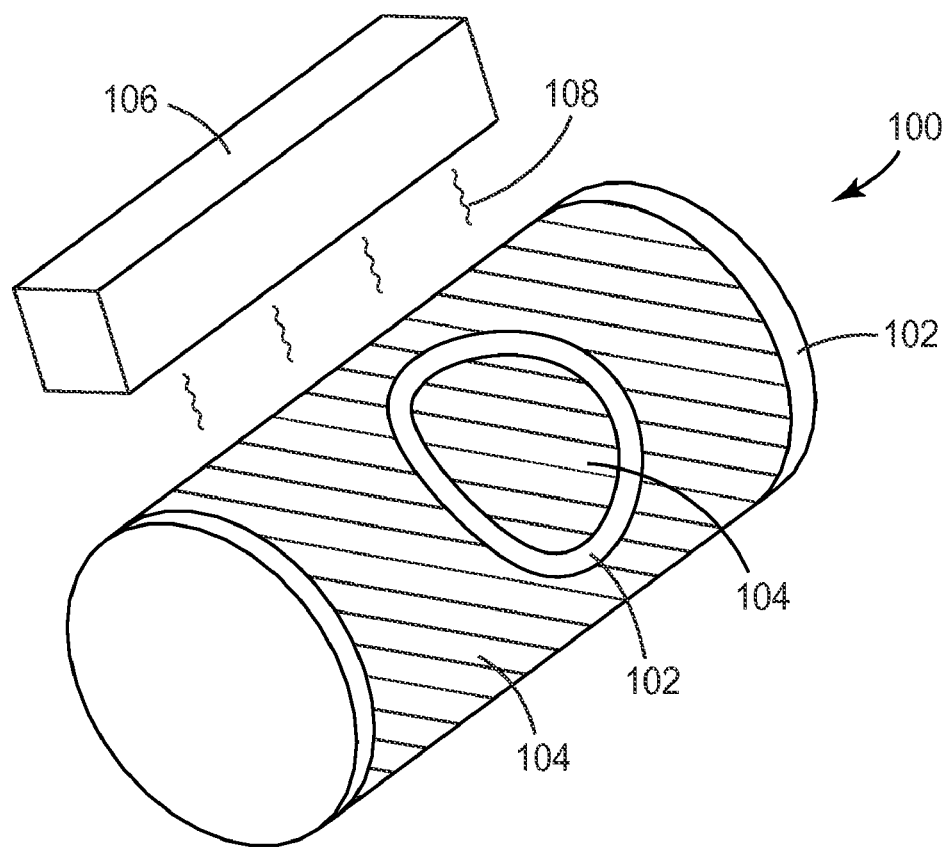
FIG. 1 is a schematic of a corona treatment apparatus used to produce an embodiment of the provided dicing tape that is configured to produce a surface modification that includes a pattern.

In the following description, reference is made to the accompanying set of drawings that form a part of the description hereof and in which are shown by way of illustration several specific embodiments. It is to be understood that other embodiments are contemplated and may be made without departing from the scope or spirit of the present invention. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

In one aspect, an adhesive transfer dicing tape suitable for consecutive use as a dicing tape and a die attach adhesive is provided that includes an adhesive composition and a backing in contact with the adhesive. The backing includes a surface modification that has a pattern on the side in contact with the adhesive. The dicing tape can be used to adhere to and to hold down a semiconductor wafer during dicing where the wafer is cut or sliced into individual dice or chips. The tape can further be useful as a die attach adhesive. After dicing, the chips can be removed from the backing along with adhesive that has released from the backing. The chips with adhesive can then be moved and securely fastened to, for example, a lead frame, where wire bonding and subsequent operations can be conducted.

The adhesive composition can be any adhesive composition known to those of skill in the art that has good adhesion to electronic devices, such as semiconductor wafers, to hold them firmly during dicing into chips, can be detackified by an external power source, such as radiation or heat after dicing, can be removed from the backing and adheres to the chips, can maintain enough adhesion to adhere the chip to another substrate, such as a lead frame, and finally can function so as to permanently bond the chip after wire bonding and other operations.

Useful adhesive compositions can be those compositions that can be cured upon exposure to heat or light radiation and include adhesives based upon polyolefins, poly(meth)acrylates, epoxies, polyimides, isocyanurates, as well as two stage (called B stage) adhesives which can be a combination of more than one of these types of materials. Exemplary adhesive compositions useful in the provided dicing tape and die attachment adhesive include those disclosed in U.S. Pat. Nos. 5,110,388; 5,118,567; and 5,356,949 (Komiyama et al.); 5,705,016 and 5,888,606 (Senoo et al.); U.S. Pat. Publ. Nos. 2005/0031795 (Chaudhury et al.), 2007/0190318 (Asai et al.); Japanese Pat. Publ. Nos. 2004-349441 (Shohei et al.), 2006-104246 (Harunori), and 08-053655 (Senoo et al.). Of particular interest are adhesives which are disclosed in applicant's copending application, U.S. Pat. Appl. Publ. No. 2010/0056725 (Larson et al). The adhesive compositions can have a release liner in contact with the adhesive.

In one embodiment, the adhesive composition can include an acrylate ester polymer having a functional group, a multi-functional thermosetting resin, wherein the acrylate ester polymer and the thermosetting resin are capable of reacting with each other, a multi-functional acrylate ester, an acrylate ester polymerization catalyst or curing agent, a thermally-latent catalyst suitable for curing the multi-functional thermosetting resin, and an acrylic acid salt.

Suitable acrylate ester polymers having a functional group include, for example, copolymers of linear or branched monofunctional unsaturated acrylates or methacrylates of non-tertiary alkyl alcohols, the alkyl groups of which have from 1 to 14 and, in particular, from 4 to 12 carbon atoms with one or more (meth)acrylate functional monomers bearing an additional functional group. Preferred monofunctional monomers include butyl (meth)acrylate, 2-ethylhexyl (meth)acrylate, ethyl (meth)acrylate, methyl (meth)acrylate, n-propyl (meth)acrylate, isopropyl (meth)acrylate, t-butyl (meth)acrylate, pentyl (meth)acrylate, n-octyl (meth)acrylate, isooctyl (meth)acrylate, isononyl (meth)acrylate and 2-ethylbutyl (meth)acrylate. (Meth)acrylate functional monomers bearing an additional functional group include the monomers above wherein the (meth)acrylate ester also bears one or more substituents selected from a carboxylic acid group, a hydroxyl group, a glycidyl group, an amide group, and an anhydride group. Particularly preferred in some embodiments are (meth)acrylic ester monomers having an additional functional group that may be one or more of acrylic acid, methacrylic acid, hydroxy ethyl acrylate, hydroxyethyl methacrylate, hydroxy propyl acrylate, hydroxypropyl methacrylate, hydroxybutyl acrylate, hydroxybutyl methacrylate, glycidyl acrylate, or glycidyl methacrylate, and N-methylol acrylamide.

Suitable multi-functional thermosetting resins include, for example, polyepoxy functional resins and their aziridine analogs. The multifunctional glycidyl ether epoxy resin is present in the adhesive compositions of the invention at an amount from about 15 weight percent (wt %) to about 40 wt %. In other embodiments, the multifunctional glycidyl ether epoxy resin is present in the adhesive compositions in an amount from about 23 wt % to about 37 wt %. Other adhesive compositions of the invention can contain any amount between 15 wt % and 40 wt % of the multifunctional glycidyl ether epoxy resin.

Preferred multifunctional glycidyl ether epoxy resins include those epoxy resins having on average more than two glycidyl groups within a molecule. Specific examples of the glycidyl ether epoxy resin include multifunctional phenol novolak-type epoxy resins (synthesized by reacting phenol novolak with epichlorohydrin), cresol novolak epoxy resins, and bisphenol A novolak epoxy resins. Examples of multifunctional glycidyl ether epoxy resins include those epoxy resins available as EPON 1050, EPON 160, EPON 164, EPON 1031, EPON SU-2.5, EPON SU-3, and EPON SU-8, available from Hexion Specialty Chemicals, Columbus, Ohio; the "DEN" series of epoxy resins, available from Dow Chemical Company, Midland Mich.; and TACTIX 756, and TACTIX 556 epoxy resin, available from Huntsman Chemical, East Lansing, Mich.

In some embodiments, useful multifunctional glycidyl ether epoxy resins can be diglycidyl ethers of bisphenol A and can include, but are not limited to, those having the trade designations EPON Resins 825, 826, and 828, available from Hexion Specialty Chemicals; D.E.R. 330, 331, and 332 resins, available from Dow Chemical Company; and Araldite GY 6008, GY 6010, and GY 2600 resins, available from Ciba Specialty Chemicals, Tarrytown, N.Y.

In other embodiments useful multifunctional glycidyl ether epoxy resins can be diglycidyl ethers of bisphenol F and can include, but are not limited to those having the trade designations EPON Resin 862 resin, available from Hexion Specialty Chemicals; and ARALDITE GY 281, GY 282, GY 285, PY 306, and PY 307 resins, available from Ciba Specialty Chemicals. The multifunctional glycidyl ether epoxy resins usually have an epoxy equivalent weight of from about 170 to about 500, in other embodiments, from about 170 to about 350, and in other embodiments from about 170 to about 250. Ranges for the average epoxy functionality include from about 1.5 to about 10.

The acrylate ester polymer and the thermosetting resin are capable of reacting with each other, typically via a ring-opening reaction or a condensation reaction, such that the reaction product is a chain extended and/or crosslinked polymer. Suitable multi-functional acrylate esters include, for example, (meth)acrylate esters of di-, tri-, and tetra-hydroxy compounds such as ethylene glycol diacrylate, polyethylene glycol diacrylate, ethylene glycol dimethacrylate, hexanediol diacrylate, triethylene glycol diacrylate, trimethylolpropane triacrylate, glycerol triacrylate, pentaerthyitol triacrylate, pentaerythritol trimethacrylate, pentaerythritol tetraacrylate and pentaerythritol tetramethacrylate. Acrylate esters of hyperbranched polyols such as CN2301, 2302, 2303, 2304 available from Sartomer Co., Exton Pa. can also be useful. Trimethylolpropane triacrylate is particularly suitable for reducing tack of the adhesive by photochemically induced polymerization.

Suitable acrylate ester polymerization catalysts include, for example, photoinitiators and thermal initiators with photoinitiators being generally preferred in applications where extended shelf-life is particularly desirable. Examples of suitable ultraviolet-activated photoinitiators are available as IRGACURE 651, IRGACURE 184, IRGACURE 369 and IRGACURE 819, and DAROCUR 1173, all products of Ciba Specialty Chemicals Co., and LUCIRIN TPO-L, a product of BASF Corp.

In some embodiments, thermal initiators may be used. Thermal initiators include organic peroxides (e.g., benzoyl peroxide), azo compounds, quinones, nitroso compounds, acyl halides, hydrazones, mercapto compounds, pyrylium compounds, imidazoles, chlorotriazines, benzoin, benzoin alkyl ethers, diketones, phenones, and mixtures thereof. Examples of suitable thermal initiators are VAZO 52, VAZO 64 and VAZO 67 azo compound thermal initiators, all available from DuPont.

Suitable thermally-latent catalysts suitable for curing the multi-functional thermosetting resin include, for example, latent catalysts that can be useful in one part epoxy adhesives. Illustrative catalysts include blocked imidazoles, such as MZ-A, MA-OK and PHZ-S available from Air Products, Allentown, Pa., and polymer bound imidazoles such as INTELIMER 7004 available from Landec Inc., Menlo Park, Calif. In some embodiments, imidazole catalysts, especially solids, such as 1,3-dialkylimidiazolium salts, imidiazole derivative-transition metal complexes, 2-ethyl-4-methylimidiazole, 2-phenyl-4-methylimidiazole, and 2,4-diamino-6-[2'-methylimidazolyl-(1)']ethyl-s-triazine can be used. The catalyst, if present in an embodiment, comprises at least 0.01 wt %, preferably at least about 0.1 wt % of the composition. In other embodiments, the catalyst comprises below about 5 wt % of the composition, preferably no more than about 10 wt %.

Suitable acrylic acid salts include, for example, (meth) acrylic acid containing oligomer units joined by one or more polyvalent metal salt bridges. Such salt bridges may dissociate at higher than ambient temperatures thereby improving flow of the adhesive composition. Suitable acrylic acid salts include CN2404, a polyester acrylate oligomer, and CN2405, a urethane acrylate oligomer both available from Sartomer, Exton, Pa.

In some embodiments, the multi-functional thermosetting resin can be an epoxy resin. In some embodiments, the acrylate ester polymer can be a copolymer of butylacrylate and glycidyl methacrylate. In still other embodiments, the multi-functional acrylate ester can include trimethylolpropanetriacrylate (TMPTA).

In some embodiments, the polymer catalyst or curing agent can be a photo-initiated free radical curing agent. In some embodiments, the thermally-latent catalyst can be an imidazole accelerator. In yet other embodiments, the acrylic acid salt can be a metal salt of an acrylic or methacrylic acid.

The backing is not particularly limited. The backing may be any of a polymeric backing, a metal backing, a backing comprising fibers, a backing comprising of paper, and the like, and it is preferred to use a polymeric backing Examples of polymeric backings include polymeric films or sheets. Examples of backings constituting polymeric films or sheets include polyolefin resins (e.g., low-density polyethylene, linear polyethylene, medium-density polyethylene, high-density polyethylene, ultralow-density polyethylene, propylene random copolymers, propylene block copolymers, propylene homopolymers, polybutene, and polymethylpentene), ethylene/vinyl acetate copolymers, ionomer resins, ethylene/(meth)acrylic acid copolymers, ethylene/(meth)acrylic ester copolymers (e.g., random copolymers and alternating copolymers), ethylene/butene copolymers, ethylene/hexene copolymers, polyurethanes, polyester resins (e.g., poly(ethylene terephthalate), poly(ethylene naphthalate), poly(butylene terephthalate), and poly(butylene naphthalate)), polyimides, polyamides, polyetherketones, polyethers, polyethersulfones, polystyrene resins (e.g., polystyrene), poly(vinyl chloride), poly(vinylidene chloride), poly(vinyl alcohol), poly(vinyl acetate), vinyl chloride/vinyl acetate copolymers, polycarbonates, fluororesins, cellulosic resins, and materials obtained by crosslinking these resins. These constituent materials can be used alone or in combination of two or more thereof. The constituent material of the polymeric film or sheet can have functional groups incorporated therein, or can be a material to which a functional monomer or modifying monomer is grafted. Backings that are preferred include optically clear, elastomeric materials such as polyolefins.

The backing preferably can be one that at least partly transmits radiation (e.g., X-ray, ultraviolet, or electron beam) so that the radiation-curable pressure-sensitive adhesive layer formed on the backing can be cured by irradiating the layer from the backing side. The backing can be of single layer or multilayer construction. The backing can contain conventional additives or ingredients such as, e.g., fillers, flame retardants, age resistors, antistatic agents, softeners, ultraviolet absorbers, antioxidants, plasticizers, and surfactants.

The backing can have at least one surface in contact with the adhesive. The part of the backing in contact with the adhesive can include a surface modification that has a pattern. By surface modification it is meant that the surface of the backing has been treated so as to alter the surface chemistry of the backing and to change its surface energy. Ionizing radiation can be used to produce the surface modification and can include, for example, corona treatment, electron beam treatment, plasma treatment, flame treatment, ultraviolet treatment, or any other treatment that that can be directed at the backing Patterning of the radiation, and thus the surface modification can be accomplished, for example, by masking parts of the radiation so that the radiation only effects patterned portions of the backing or by rastering the radiation to produce a pattern. It is also contemplated that the surface modification can be accomplished by chemical means such as by use of a patterned primer or a patterned etching step.

In some preferred embodiments, corona treatment can be used to produce patterned surface modifications on backings such as polymeric backings Corona discharge can be produced by equipment that includes a high-frequency power generator, a high-voltage transformer, a stationary electrode, and a treater ground roll or drum. Standard electrical power is converted into higher frequency power by the transformer which is then supplied to the treater station. The treater station applies this power using ceramic or metal electrodes over an air gap and directed towards the material's surface. This treatment creates a better bonding surface on the backing.

Patterned surface modification of webs using corona treatment has been disclosed, for example, in U.S. Pat. Nos. 4,879,430 and 5,139,804 (Hoffman). Using this process, an applicator roll or drum is provided that has patterns recessed into it by, for example, engraving. A polymeric web, such as a polyolefinic web, can be passed over the roll and simultaneously exposed to a corona discharge from the top side, away from the roll. The corona discharge can modify the surface of the top side of the web unselectively, meaning without any pattern. On the backside of the web (the side facing the roll), the recessed patterns can allow for the entrapment of air where there is no contact with the applicator roll. This entrapped air can be activated by the corona treatment and can create a patterned surface modification on the underside of the web in the location of the entrapped air.

Also useful in one embodiment of the provide method are tapes having a thickness in the range of about 125 μm to about 500 μm, for use to pattern mask the applicator roll, such as those in the recited patents by Hoffman. In some embodiments it has been found to be practical to use polymeric masks to create a surface modification that includes a pattern. A particularly preferred embodiment uses a thick magnetic polymeric web that is cut to a pattern and magnetically adhered to the applicator roll. This material, available from Master Magnetics Inc., Anaheim, Calif., can be easily cut to a pattern and placed on the drum so as to create patterned pockets that will result in surface modification that includes a pattern upon wrapping a polymeric web around the drum and exposing the web to corona treatment.

In some embodiments, the surface modification that includes a pattern can be in the form of a closed loop. This loop may be circular, oval, elliptical, polygonal, or irregular. In some preferred embodiments the surface modification that includes a pattern can be a closed loop with a circular pattern and can form a ring or annulus. A ring or annulus is a particularly useful pattern to use when the wafer to be diced has a circular shape. However, it is contemplated that the pattern can be any pattern at least partially surrounding the wafer dicing area. It is also possible that the pattern is not a complete loop but has some breaks in it and consists therefore of segments of a closed loop. For example, the pattern can be in the shape of a ring or an annulus but be made up of a number of pattern corona-treated dots, segments, X's, or a collection of any small shaped treated areas that are arranged in the shape of a closed loop.

Figure 3A:
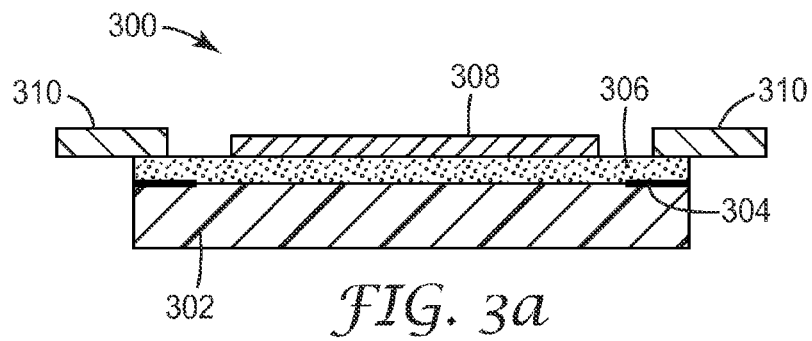
FIG. 3a is a cross-sectional view of a provided embodiment showing a backing, adhesive, surface-modification, wafer, and dicing frame.
Figure 3B:
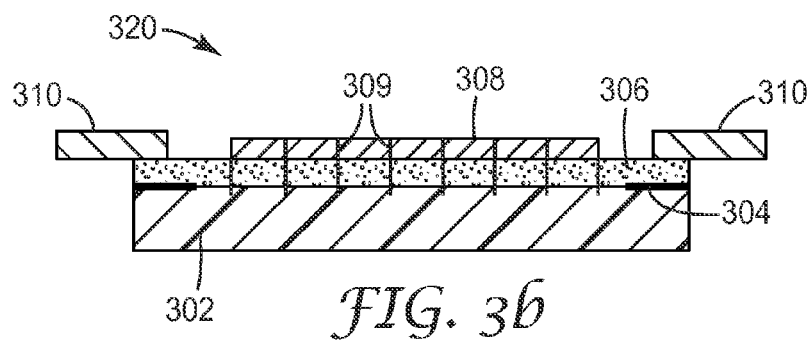
FIG. 3b is a cross-sectional view of the embodiment shown in FIG. 3a showing a cut or diced wafer.
Figure 3C:
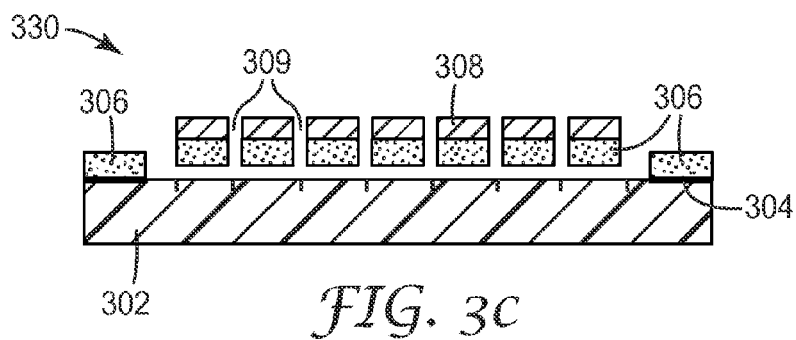
FIG. 3c is a cross-sectional view of the embodiment shown in FIG. 3b in which the adhesive has been detackified, the dicing frame removed, the dicing tape stretched, and the chips removed.
Figure 4:
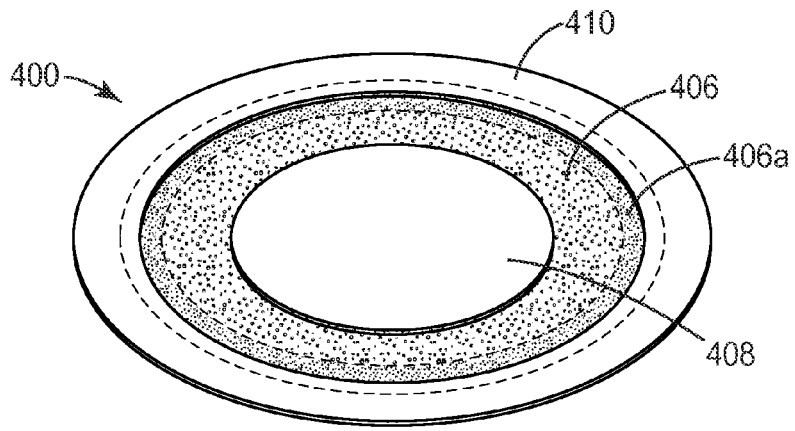

In another aspect an article is provided that includes a backing having a surface modification that includes a pattern, an adhesive in contact with the pattern, a semiconductor wafer in contact with the adhesive, and a dicing frame in contact with the adhesive, wherein the dicing frame surrounds the wafer and at least a part of the adhesive directly under the dicing frame is in contact with at least a portion of the pattern. Details of forming a surface modification that includes a pattern and the adhesive compositions useful in this article have been discussed. The article also includes a dicing frame. The dicing frame can used to hold down the dicing tape and the wafer during the dicing operation so that the wafer can be cut cleanly, can be prevented from chipping, and can not bend or twist during the dicing so as to cause damage to the wafer. The dicing frame is usually in the form of a closed loop. In some embodiments it is preferred that the surface modification that includes a pattern has the same shape and slightly larger dimensions than the dicing frame. This relationship is shown in FIG. 4 which is discussed later. Furthermore, it is preferred that the dicing frame is located directly above the surface modification that includes a pattern as shown in FIGS. 3*a*-3*c* and FIG. 4. When the dicing frame is located directly above the surface modification and is in contact with adhesive, the adhesive adheres to the backing and allows the backing and adhesive to be removed cleanly after the dicing operation. When the backing includes a surface modification adhesive failure can occur between the adhesive and the dicing frame when the dicing frame is removed.

Finally, a method of dicing semiconductor wafers is provided that includes a method of dicing semiconductor wafers is provided that includes providing an adhesive in contact with a backing that has a surface modification that includes a pattern, attaching a semiconductor wafer to the adhesive, attaching a dicing frame to the adhesive so that the dicing frame is in contact with the adhesive and surrounds the wafer, wherein at least part of the adhesive under the dicing frame is in contact with at least part of the pattern, and dicing the wafer to form chips. This method is shown, for example, in the figures as represented by the sequence of FIGS. 3*a*-3*c*.

In one embodiment, after the wafers have been diced, the adhesive can be partially cured. Partial curing can be accomplished by heat or light. If light, such as visible or ultraviolet radiation, is used to partially cure the adhesive then the backing should be transparent to the wavelengths that produce the curing as discussed earlier. The irradiation is done, preferably, through the backside of the backing Partial curing of the adhesive can occur upon exposure of the adhesive to radiation.

After partial curing, the adhesive can become detackified enough to encourage adhesive failure between the adhesive and the backing. The adhesive can remain adhered to the chip and can still maintain some tackiness. The chips containing cured adhesive can then more easily be removed from the backing Finally the dicing frame can be removed.

FIG. 1 is a schematic of an embodiment of a corona treatment apparatus that can be used to produce an embodiment of the provided dicing tape that includes a surface modification that includes a pattern in the shape of an annulus. The corona treatment apparatus 100 comprises grounded stainless steel drum 102. In the illustrated embodiment, the drum is covered (wrapped) with magnetic sheeting 104. The sheeting has two holes 102 (one is not shown but is opposite hole 102 on the hidden side of the drum) cut into it that are circular in shape. Two additional circular pieces of magnetic sheeting 104 having radii smaller than the radii of the two holes are located in the center of the holes on either side of the drum. The result is exposure of an annulus shape of drum 102. Corona treater 106 (power supply not shown) is situated so as to provide ionizing radiation 108 to the drum. A backing web (not shown) is passed around drum 102 and under corona treater 106 so that the ionizing radiation 108 impinges upon the backing web. The corona treatment causes unselective surface modification of the top side of the backing. In addition, in the areas of the annulus that are recessed, pockets of air are trapped and a dielectric barrier discharge is created which causes an annular surface modification pattern on the backside of the web facing the drum.

Figure 2:
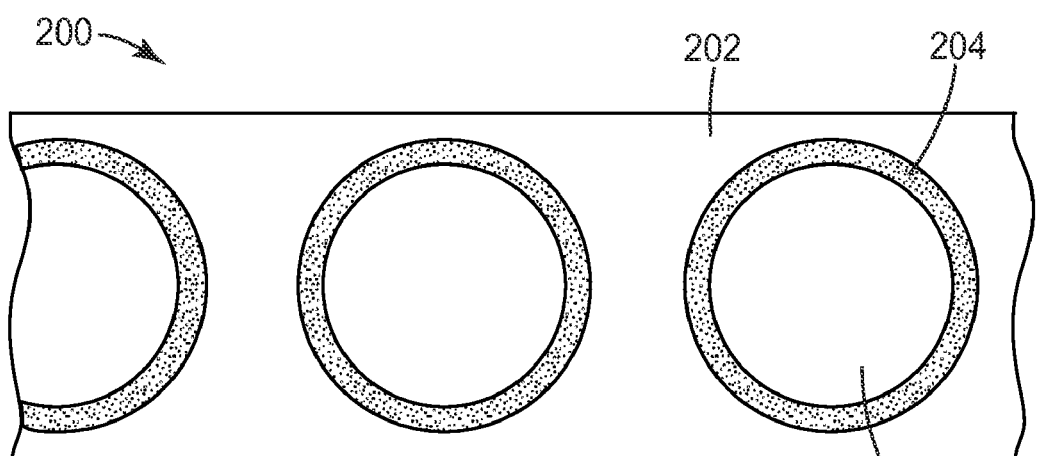
FIG. 2 is perspective view of a backing sheet that has a surface modification that includes a pattern produced by the apparatus illustrated in FIG. 1.

FIG. 2 is a bottom side view (side towards the drum of the corona) of a web 200 with surface modification that has been passed through the apparatus of FIG. 1. In this embodiment, the backing web 202 is made of polyolefin. The top side of the web has been unselectively surface modified by the corona. The bottom side of the web has regular annular patterns of surface modification 204 resulting from being run though the corona treater illustrated in FIG. 1.

FIGS. 3a-3c are cross-sectional views of an embodiment of an article that includes the provided dicing tape and die attach film. FIG. 3a shows the article 300 at the beginning of the dicing process. The article includes backing 302 that has surface modification on its top side as indicated by area 304 (edge-on view of annular pattern). On top of the backing is adhesive 306 to which semiconductor wafer 308 has been attached. The article also includes dicing frame 310 (edge-on view of annular frame). The frame 310 holds down the backing-adhesive-wafer combination during dicing.

FIG. 3b is a view of article 320 after the dicing operation. Article 320 includes backing 302 that has surface modification on its top side as indicated by area 304. Adhesive layer 306 is located on top of the backing and has wafer 308 adhered thereto. The wafer 308 has been diced with a number of cuts 309 made into it. In this embodiment cuts have been made through the wafer and the adhesive layer and slightly into the backing Dicing frame 310 is still holding the article down.

FIG. 3c shows a view of article 330 that has backing 302 with surface modification 304 as shown in FIGS. 3a and 3b. However, in this view, the adhesive has been detackified by curing through backing 302. The substrate 302 has been stretched to separate chips 308 that now have adhesive 306 adhered to them. The chips with adhesive are removed from the backing and can be attached to a substrate (not shown) for wire bonding, etc. In FIG. 3c the dicing frame has been removed and adhesive 306 that was under the dicing frame and on the surface modification 304 remains on the backing.

FIG. 4 is a perspective view of article 400 (of the article illustrated in a cross-sectional view in FIG. 3a). In this view adhesive 406 has been coated over the backing (not shown). In region 406a, the adhesive is over the annular surface modification of the backing. This region also extends under dicing frame 410. Semiconductor wafer 408 has been adhered to the adhesive. The wafer is ready for dicing in this view.

Objects and advantages of this invention are further illustrated by the following examples, but the particular materials and amounts thereof recited in these examples, as well as other conditions and details, should not be construed to unduly limit this invention.

EXAMPLES

| Designation | Source | Description |
|---|---|---|
| EPICLON 7200H | Dainippon Ink and Chemicals Industries, Tokyo, Japan | Epoxy Resin |
| EPON 828 | Hexion Specialty Chemicals, Columbus, OH | Epoxy Resin |
| EPON 862 | Hexion Specialty Chemicals | Epoxy Resin |
| TMPTA | Sartomer Company Inc., Easton, PA | Trimethylolpropanetriacrylate |
| CN2405 | Sartomer Company Inc., Easton, PA | Urethane/acrylic oligomer-Metallic ion |
| IRGACURE 369 | Ciba Specialty Chemicals, Tarrytown, NY | Free radical curing agent |
| CUREZOL 2 MZ Azine | Air Product and Chemical Inc., Allentown, PA | Epoxy resin curing agent |
| A187 Silane | Available from Natrochem, Savannah, GA | Gamma-glycidyloxypropyl trimethoxysilane |
| EPON 164 | Hexion Specialty Chemicals | Epoxy Resin |
| TACTIX 756 | Dow Chemical, Midland, MI | Epoxy Resin |
| IRGACURE 651 | Ciba Specialty Chemicals, Basel, Switzerland | Free radical curing agent |

Preparatory Example 1

Preparation of Butylacrylate/Glycidyl Methacrylate (BA/GMA) Copolymer

The following were added to a 946 mL bottle: 72.0 g of butyl acrylate (Dow Chemical Co., Midland, Mich.), 48.0 g of glydicyl methacrylate (Sartomer Co. Inc., Easton, Pa.), 0.18 g of 2,2'-azobis (2-methylbutanenitrile) (DuPont, Wilmington, Del.), 140 g of ethyl acetate, and 140 g of toluene. The solution was purged with nitrogen for two minutes at a rate of one liter per minute. The bottle was sealed and placed in a water bath that was maintained at 60° C., for 24 hours. The reaction mixture was 29.5 wt % solids, had a measured inherent viscosity of 0.78 dL/g and a Brookfield viscosity of 0.7 Pascal-seconds.

TABLE I

Formulations for Examples 1-7

| | Example | | | | | | |
|---|---|---|---|---|---|---|---|
| | 1 | 2 | 3 | 4 | 5 | 6 | 7 |
| BA/GMA (3:2) (a) | 77.1 | 9.24 | — | — | — | 9.24 | 10.1 |
| EHA/GMA (3:2) (a) | — | — | 18.3 | — | — | — | — |
| EHA/GMA (1:1) (a) | — | — | — | 9.15 | 9.15 | — | — |
| Epiclon 7200H | — | 1.35 | 1.8 | 0.9 | — | 1.35 | — |

TABLE I-continued

Formulations for Examples 1-7

| | Example | | | | | | |
|---|---|---|---|---|---|---|---|
| | 1 | 2 | 3 | 4 | 5 | 6 | 7 |
| Epon 828 | 4.8 | 0.35 | 1.8 | 0.9 | 0.9 | 0.45 | — |
| Epon 862 | — | 0.1 | — | — | — | — | — |
| Curezol ® 2 MZ Azine | 1.4 | 0.1 | 0.2 | 0.1 | 0.001 | 0.1 | 0.18 |
| Irgacure 369 | — | 0.02 | 0.03 | 0.02 | 0.02 | 0.02 | — |
| TMPTA | 2.8 | 0.3 | 0.2 | 0.3 | 0.3 | 0.3 | 0.4 |
| CN2405 | — | 0.2 | 0.8 | 0.2 | 0.2 | 0.2 | 0.1 |
| A187 Silane | 0.3 | — | — | — | — | — | 0.01 |
| Epon 164 | — | — | — | — | 0.9 | — | — |
| Tactix 756 | 13.1 | — | — | — | — | — | 1.33 |
| Irgacure 651 | 0.5 | — | — | — | — | — | 0.03 |

(a) Weight of 30% solution of the polymer in ethyl acetate/toluene (1:1)

Preparation of Patterned Backing

Polyolefin liner was pattern corona treated with an annular pattern as discussed above. A flexible metal magnetic mask was created out of flexible magnetic sheeting (1.5 mm thickness) was wrapped around the metal backing roll of the corona treater. The mask had a pattern and the set-up had a configuration as illustrated in FIG. 1. An air corona electrode with a gap of 60 mils (1.5 mm) was used. The film was pulled through the corona treater at a speed of 15 m/min. The corona power was 620 W, the normalized corona energy was 0.54 (J/cm$^2$), and the room humidity was 11% at room temperature.

Example 1

The components listed in Table 1 for Example 1 were mixed in a high shear mixer, coated onto silicon-treated PET liner (37 μm thickness), and then dried for 5 minutes in a forced air oven at 65° C. The adhesive coated liner was then laminated at room temperature and 40 psi (276 kPa) to the pattern corona treated polyolefin backing on the side with the pattern. The PET liner was removed and the adhesive/corona-treated polyolefin was laminated to a polished silicon wafer. Peel samples were prepared in a cross web direction so that the sample included the 1 inch (2.54 cm) wide corona-treated section. Samples peeled prior to UV exposure showed failure at the interface between the adhesive and the silicon wafer. After the samples were exposed to 0.5 J/cm$^2$ UVA radiation the failure mode on peel changed to failure between the film backing and the adhesive except in the 2.54 cm strip which was corona-treated. In that section, the failure was between the adhesive and the silicon wafer.

Examples 2-7

The components listed in Table 1 for Examples 2-7 were prepared and tested as per Example 1.

Various modifications and alterations of this invention will become apparent to those skilled in the art without departing from the scope and principles of this invention, and it should be understood that this invention is not to be unduly limited to the illustrative embodiments set forth hereinabove.

What is claimed is:

1. An adhesive transfer dicing tape suitable for consecutive use as a dicing tape and a die attach adhesive comprising:
    an adhesive composition; and
    a backing having a surface in contact with the adhesive composition,
    wherein the surface of the backing in contact with the adhesive composition has a pattern that has altered surface energy,
    wherein the adhesive is in contact with at least a portion of the pattern, and
    wherein the pattern comprises a closed loop.

2. The tape according to claim 1 wherein the adhesive composition comprises radiation curable groups.

3. The tape according to claim 2 wherein the adhesive composition detackifies upon exposure to radiation.

4. The tape according to claim 1 wherein the adhesive composition further comprises:
    an acrylate ester polymer having a functional group;
    a multi-functional thermosetting resin;
    a multi-functional acrylate ester;
    an acrylate ester polymerization catalyst or curing agent;
    a thermally-latent catalyst suitable for curing the multi-functional thermosetting resin; and
    an acrylic acid salt,
    wherein the acrylate ester polymer and the thermosetting resin are capable of reacting with each other.

5. The composition of claim 4 wherein the multi-functional thermosetting resin comprises an epoxy resin.

6. The composition of claim 4 wherein acrylate ester polymer comprises a copolymer of butylacrylate and glycidyl methacrylate.

7. The composition of claim 4 wherein the multi-functional acrylate ester comprises trimethylolpropanetriacrylate.

8. The composition of claim 4 wherein the polymerization catalyst or curing agent comprises a photo-initiated free radical curing agent.

9. The tape according to claim 1 wherein the adhesive composition further comprises:
    at least about 50 wt % of a functional group containing acrylate ester polymer;
    from about 20 wt % to about 40 wt % of a multi-functional thermosetting resin;
    an effective amount of a multi-functional acrylate ester;
    a catalyst for curing the acrylate ester polymer;
    a thermally latent catalyst for curing the multi-functional thermosetting resin; and
    an acrylic acid salt,
    wherein the acrylate ester polymer and the thermosetting resin are capable of forming an adhesive reaction product.

10. The tape according to claim 1 wherein the closed loop comprises an annulus.

11. The tape according to claim 1 wherein the pattern having altered surface energy is produced with ionizing radiation.

12. The tape according to claim 11 wherein the ionizing radiation comprises radiation produced by corona treatment.

* * * * *